United States Patent
Schweitzer, III et al.

(10) Patent No.: US 11,012,016 B2
(45) Date of Patent: May 18, 2021

(54) ENERGY PACKET CONTROL OF GENERATOR PRIME MOVER

(71) Applicant: Schweitzer Engineering Laboratories, Inc., Pullman, WA (US)

(72) Inventors: Edmund O. Schweitzer, III, Pullman, WA (US); Gregary C. Zweigle, Pullman, WA (US); Ellery A. Blood, Moscow, ID (US); Scott M. Manson, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 17/066,982

(22) Filed: Oct. 9, 2020

(65) Prior Publication Data
US 2021/0111652 A1 Apr. 15, 2021

Related U.S. Application Data

(60) Provisional application No. 62/914,955, filed on Oct. 14, 2019.

(51) Int. Cl.
| | |
|---|---|
| *H02P 9/42* | (2006.01) |
| *H02P 9/10* | (2006.01) |
| *H03H 17/02* | (2006.01) |
| *F02D 9/00* | (2006.01) |
| *H02P 9/04* | (2006.01) |
| *F02D 31/00* | (2006.01) |

(Continued)

(52) U.S. Cl.
CPC ............... *H02P 9/42* (2013.01); *F02D 9/00* (2013.01); *H02P 9/04* (2013.01); *H02P 9/105* (2013.01); *H03H 17/0202* (2013.01); *F02D 31/00* (2013.01); *F02D 39/00* (2013.01); *F02D 41/00* (2013.01); *F02M 21/00* (2013.01); *F02P 1/00* (2013.01); *H03H 2017/0205* (2013.01)

(58) Field of Classification Search
CPC ..................................................... H02P 9/42
See application file for complete search history.

(56) References Cited

U.S. PATENT DOCUMENTS

| | | | | |
|---|---|---|---|---|
| 7,078,825 B2* | 7/2006 | Ebrahim | ............. | H02P 9/04 290/52 |
| 8,068,937 B2* | 11/2011 | Eaves | ............. | H02H 3/30 700/293 |

(Continued)

OTHER PUBLICATIONS

Elif Uysal-Biyikoglu, et. Al "Energy-Efficient Packet Transmission Over a Wireless Link", IEEE/ACM Transactions on Networking, vol. 10, No. 4, Aug. 2002.

(Continued)

*Primary Examiner* — Kevin R Steckbauer
(74) *Attorney, Agent, or Firm* — Stoel Rives LLP

(57) ABSTRACT

A controller may use energy packets to control a prime mover of a machine. The controller may include an energy packet measurement control to calculate energy packets and convert the energy packets into a fuel valve reference. Further, a frequency control may receive system feedback associated with the monitored machine and generate a frequency correction based on the system feedback. The controller may add the energy packet value and the frequency correction to determine a prime mover power reference and provide the prime mover power reference to a fuel valve control of the machine.

20 Claims, 12 Drawing Sheets

(51) Int. Cl.
*F02D 41/00* (2006.01)
*F02M 21/00* (2006.01)
*F02D 39/00* (2006.01)
*F02P 1/00* (2006.01)

(56) References Cited

U.S. PATENT DOCUMENTS

| | | | | |
|---|---|---|---|---|
| 8,275,488 B2* | 9/2012 | Kim | ........................ | H02P 9/102 700/287 |
| 8,338,971 B2* | 12/2012 | Radtke | ..................... | B23K 9/10 290/40 B |
| 8,881,498 B2* | 11/2014 | Olia | ....................... | F01D 17/145 60/39.3 |
| 9,184,795 B2* | 11/2015 | Eaves | ................... | G01R 29/027 |
| 9,248,826 B2* | 2/2016 | Hayashi | ................ | B60W 20/14 |
| 9,574,511 B2* | 2/2017 | Kim | ...................... | F02D 41/083 |
| 9,753,096 B2* | 9/2017 | Kim | .................... | H02P 29/0241 |
| 9,853,689 B2* | 12/2017 | Eaves | ..................... | H04B 3/548 |
| 9,906,041 B2* | 2/2018 | Ravikumar | ............... | H02J 3/42 |
| 9,912,158 B2* | 3/2018 | Ravikumar | ............. | H02J 3/381 |
| 10,920,703 B1* | 2/2021 | Blood | ................... | F02B 77/083 |
| 2004/0008010 A1* | 1/2004 | Ebrahim | ................... | H02P 9/30 322/44 |
| 2009/0198386 A1* | 8/2009 | Kim | ....................... | G05B 11/42 700/298 |
| 2009/0204268 A1* | 8/2009 | Eaves | ..................... | H02H 3/30 700/293 |
| 2010/0038907 A1* | 2/2010 | Hunt | ........................ | F02C 3/22 290/7 |
| 2012/0138582 A1* | 6/2012 | Radtke | .................... | B23K 9/10 219/121.27 |
| 2014/0379191 A1* | 12/2014 | Hayashi | ................ | B60W 10/06 701/22 |
| 2015/0039252 A1* | 2/2015 | Kim | ........................ | H02P 9/102 702/58 |
| 2015/0215001 A1* | 7/2015 | Eaves | ................... | H04L 1/0033 375/224 |
| 2016/0025023 A1* | 1/2016 | Kim | ................. | B60W 30/1884 701/22 |
| 2016/0134331 A1* | 5/2016 | Eaves | ................... | H04B 3/548 307/1 |
| 2017/0271872 A1* | 9/2017 | Ravikumar | ............. | H02J 3/381 |
| 2017/0271882 A1* | 9/2017 | Ravikumar | ............... | H02J 3/42 |
| 2020/0111176 A1* | 4/2020 | Schweitzer, III | .. | G06Q 30/0283 |

OTHER PUBLICATIONS

Erol Gelenbe, et. Al "Central or Distributed Energy Storage for Processors with Energy Harvesting", 2015 Sustainable Internet and ICT for Sustainability (SustainIT), IEEE, Apr. 2015.

Erol Gelenbe and Elif Tugce Ceran "Energy Packet Networks with Energy Harvesting", IEEE Access, vol. 4, Mar. 2016.

A. Monti, et. Al "Towards a Real Digital Power System an Energy Packet Approach", 2017 IEEE Conference on Energy Internet and Energy System Integration (E12), Nov. 2017.

Roberto Rojas-Cessa, et. Al "An Energy Packet Switch for Digital Power Grids", 2018 IEEE International Conference on Internet of Things (iThings) and IEEE Green Computing and Communications (GreenCom) and IEEE Cyber, Physical and Social Computing (CPSCom) and IEEE Smart Data (SmartData), Jul. 2018.

Ivan Smon, et Al "Local Voltage-Stability Index Using Tellegen's Theorem", IEEE Transactions on Power Systems, vol. 21. No. 3, Aug. 2006.

Engineering Institute of Technology "Fundamentals of Smart Metering—kWh and kVArh Meters" Article [online]. Jul. 13, 2017 [retrieved Dec. 3, 2019]. Retrieved from <URL:https:www.eit.edu.au/cms/resources/technical-resourses/fundamentals-of-smater-metering-kwh-and-kvarh-meters-2>.

Schneider Electric "PowerLogic-™ PM5100 Series Power and Energy Meter" User Manual [online]. Mar. 2017 [retrieved Dec. 4, 2019]. Retrieved from <URL: https://download.schneider-electric.com/files?p_enDocType=User+guide&p_File_Name=EAV15105-EN05.pdf&p_Doc_Ref=EAV15105-EN>.

Yokogawa "How to Measure Electrical Power" Article [online]. 2017 [retrieved Dec. 4, 2019]. Retrieved from <URL:https://tmi.yokogawa.com/us/library/resources/application-notes/how-to-measure-electrical-power/>.

PCT/US2020/055250 International Search Report and Written Opinion of the International Searching Authority dated Jan. 22, 2021.

* cited by examiner

ENERGY PACKET CONTROL OF GENERATOR PRIME MOVER

RELATED APPLICATIONS

This application claims priority to U.S. Provisional Application No. 62/914,955, filed Oct. 14, 2019 and entitled ENERGY PACKET CONTROL OF GENERATOR PRIME MOVER, which is hereby incorporated by reference herein in its entirety.

TECHNICAL FIELD

The present disclosure relates to controlling a generator using energy packets.

BRIEF DESCRIPTION OF THE SEVERAL VIEWS OF THE DRAWINGS

Additional aspects and advantages will be apparent from the following detailed description of preferred embodiments, which proceeds with reference to the accompanying drawings, in which.

Figure 1:
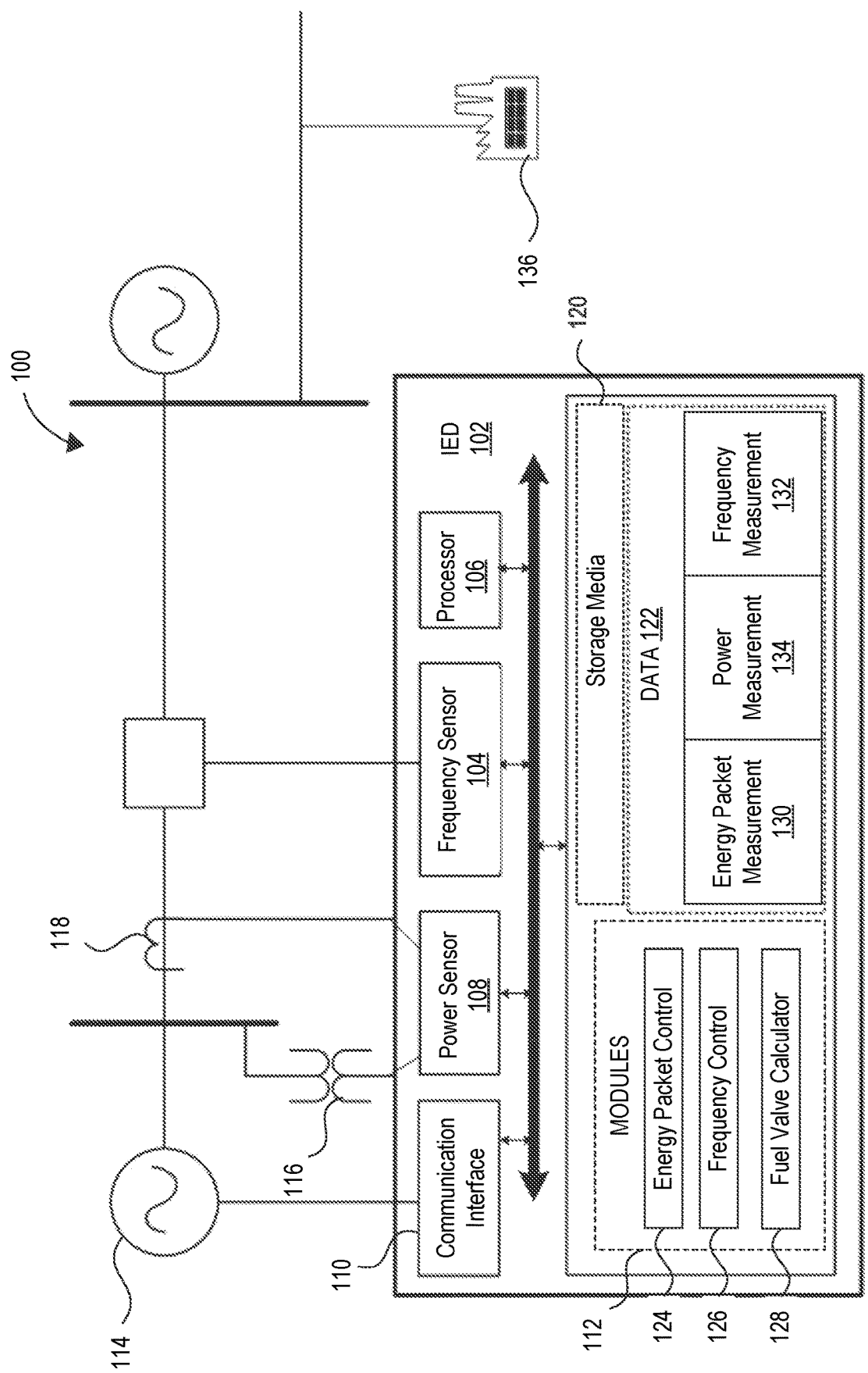
FIG. 1 illustrates an electric power delivery system in accordance with one embodiment.

To easily identify the discussion of any particular element or act, the most significant digit or digits in a reference number refer to the figure number in which that element is first introduced.

DETAILED DESCRIPTION

Prime movers of a machine (e.g., reciprocating engines, gas turbine, steam turbine, water turbine, or other) typically determine a power reference signal based on frequency. Specifically, the error between the desired frequency (nominal, or nominal minus a droop term) and the measured shaft speed. A change in load results in a momentary power imbalance and therefore rotor acceleration. It is treated as a disturbance to the frequency control system, which then adjusts the prime mover power reference to restore power balance and frequency to the desired value.

In order for a typical controller to detect a load change, the system must first experience acceleration due to the power mismatch. The acceleration eventually results in a frequency (measured at the electrical side) or speed (measured at the mechanical side) mismatch from a nominal setpoint of the prime mover. Feedback of this frequency mismatch or speed mismatch is used by the controller to detect an imbalance and adjust the prime mover (e.g., an adjustment to the fuel valve) to compensate for the imbalance with a power offset until the scaled values of the power offset and speed or frequency mismatch re-balance. Traditionally, a proportional gain was employed for this control as this could be implemented via straightforward mechanical means (e.g., a lever arm of a specific length). A typical value of this gain was 25 per unit power/per unit frequency. For example, a governor with a 60 Hz frequency setpoint, 0 kW power setpoint (e.g., with a drop line setting the frequency setpoint to the nominal frequency is equivalent to setting the dispatch power output to zero), and 25 per-unit gain may accept a full load (1 per unit power) with a 60 Hz nominal frequency resulting in 60 Hz/(25*1 pu)=2.4 Hz droop. This is often summarized as a 4% droop because $\frac{1}{25}=0.04=4\%$. Because droop is a natural byproduct of a proportional controller responding to a disturbance, such a controller is described as having "natural droop" or "a natural droop characteristic."

This natural droop characteristic has been integral in sharing of load between generators. The droop characteristic with multiple machines running in parallel results in a system frequency response that works as a load share feedback term between machines. When machines are connected with an electric power network, an angle difference between machines results in a torque between the machines that moves them towards synchronization. This "synchronizing torque" drives all synchronous machines towards operating at the same steady-state frequency. If all machines have an identical droop characteristic and nominal frequency setpoint, the steady-state equilibrium will lead them all to share load at the same per-unit value (i.e., each will produce power at an equal percentage of their rated power). The machine dispatch can then be modified by adjusting the power offset setpoint (or equivalently, the nominal frequency setpoint) of a machine up (to increase its load share percentage) or down (to decrease its load share percentage).

If more control over the steady state frequency response (e.g., isochronous operation, programmed droop, or droop response shaping) is desired, a proportional gain cannot by itself exactly track a set frequency. A load change introduces an error between the electrical load (i.e., power pulled from the rotor) and the mechanical prime mover power (i.e., power imparted onto the rotor). The power error results in a rotor acceleration. The acceleration, and therefore power difference, is proportional to the first derivative of frequency. This acceleration error is integrated over time to produce a measurable frequency error by which the proportional signal can compensate. To balance the load difference, a steady state frequency error will naturally develop providing the additional prime mover power to eliminate the power mismatch. The steady state error of natural droop control is inversely proportional to the magnitude of the proportional gain (the error can be reduced by further increasing the gain), but this cannot eliminate the error completely. To more exactly track a desired frequency setpoint, an integral term is typically included in the controller to force the frequency error asymptotically towards zero. As the frequency error is integrated to provide additional power offset to maintain matched power, the frequency error is asymptotically reduced to restore nominal frequency. Integral terms tend to decrease stability, so the gain must remain small. This forces a tradeoff between quick restoration of frequency and stability.

Similarly, to decrease the response time, a derivative gain is sometimes introduced. The derivative gain provides a quick response to sudden changes and introduces additional damping to counteract the instability introduced by the integral gain. Derivatives, however, amplify measurement noise, and therefore must be filtered in order to avoid introducing jitter. This forces another tradeoff between maintaining a responsive derivative term (short filter time constant) but keeping the gain low or allowing a more sluggish derivative timer (long filter time constant) and allowing larger gains.

A controller that uses a combination of these three control parameters and gains is called a PID controller, named after the three parameters Proportional (P), Integral (I), and Derivative (D). Tuning of PID gains may be difficult. Hundreds of methods of PID tuning for a myriad of applications exist. A PID controller works well when tuned correctly; however, correct tuning requires expertise and time. With a correctly tuned PID controller, advanced control strategies (Isochronous, Programmed droop, and droop response shaping as mentioned above, among others) can be implemented.

In isochronous operation, the frequency setpoint remains constant at the nominal frequency. A machine operating in isochronous mode must either run in isolation to other machines or provide a separate control loop to adjust power for load share purposes. Without a separate method of load share, multiple isochronous machines operating on the same network will tend to exhibit unstable power output without a separate feedback term to guide them towards a stable steady-state power share. Using a dedicated communications line to transmit load share information with machines of the same design and size, stable operations can be achieved. When machines from different manufacturers or of different sizes are paralleled, tuning becomes exponentially more challenging (if possible at all).

Natural droop establishes an inherently stable load share as the system frequency provides feedback regarding system load. Programmed droop replicates this behavior by modifying a machine's frequency setpoint based on the present power level output by that machine. The PID controller causes the machine's frequency to follow the programmed droop setpoint. Because the droop tends to follow the natural dynamics of the machine (i.e., a load increase will cause the rotor to slow), the machine will reach steady state at the modified frequency setpoint faster than if it were trying to maintain the nominal frequency as in an isochronous controller.

Many larger machines have restrictions on their transient behavior (e.g., nuclear plants). At steady state, the droop setpoint is identical to establish the desired droop-based load share, but the dynamic response is shaped by an algorithm that controls (or shapes) the setpoint change for droop response shaping. For example, a controller may use a programmed droop that includes a rate limiter so that the machine will not pick up power faster than a pre-determined setpoint. Similarly, a controller may use a method of adjusting the setpoint so that the second derivative of the setpoint is continuous to avoid overshoot.

These traditional controls use the fact that a torque imbalance is proportional to rotor acceleration. Maintaining control over frequency will force the torque and power to be balanced as a side effect. The problem with this method is that, to detect a power imbalance, the controller must wait for the resulting rotor acceleration to integrate into a speed offset. Fuel control signals are then generated from the speed error signal. The droop feedback should precisely track actual machine power to ensure accurate load share. Calculation of the droop feedback signal can be challenging. Power measurements at the machine terminals tend to introduce lag, which can increase instability. Valve position tends to not correlate exactly with power and doesn't account for machine dynamics.

Embodiments described herein use energy packet measurements to reduce lag, improve stability, and simplify tuning of a prime mover controller. The energy packet approach described herein rapidly adjusts the fuel control by directly measuring a quantity of interest, namely energy, and adjusting the machine to output the required energy based on the energy measurement. Energy packets are a technique to measure energy entering or leaving a system over fixed small intervals of time. The summation of this energy over a specific process is known as work. Power is defined as the rate of work or energy changes per unit time. The phrase "energy packet" is therefore used to distinguish the energy packet measurement, the energy transferred during each of these fixed small time intervals, from the more general term "work," Given a sufficiently small time interval, an individual energy packet would be proportional to the sampled value of instantaneous power at that moment.

A control system using energy packet measurements can quickly respond to load changes. As an example, consider an embodiment of a control system that measures energy packets every T seconds, where T could be 1 to 100 milliseconds. Consider a source, whether a machine, a solar panel, or a windmill, that is providing work at a certain rate (power) into the power system. When a breaker trips or there's a fault, the power flow out of the source (Pm) drops. The machine experiences the change in the rate of energy as soon as the fault occurs. The rate of change of energy can be measured by the control system with energy packets.

In the machine, the energy that accelerates a rotor may be calculated as $Pe=E*V/X \sin(theta)$ and $M*d^2(theta)/dt^2=Pm-Pe$, where: Pm is the power delivered from the prime mover, E is energy, V is voltage, and X is the line impedance. This power, Pm, cannot change fast, therefore the machine accelerates (i.e., $d^2(theta)/dt^2$ goes positive). Because Pm is relatively constant on these timescales, as soon as Pe decreases (say, in a few milliseconds), a control system can calculate the acceleration via $M*d^2(theta)/dt^2=Pm-Pe$. Monitoring the energy packets is better than waiting for frequency to change, because the frequency change is a lagging indicator of the problem.

In some embodiments, a system feedback term is included via metered droop to correct residual frequency errors. The metered droop can include a power reference from both ends of the machine, a first power reference between the controller and the mechanical components via a valve reference signal, and a second power reference at the machine terminals after the reference has progressed through multiple second order dynamical systems. Capturing the power on both ends may prevent oscillatory instabilities due to limit cycles of the machine's transient response delay.

Embodiments herein describe systems and devices where there may be no dependency on communication for stable operation in parallel with other distributed energy resources (DERs). Additionally, some embodiments reduce failure risk by not having single points of failures in the design. Further embodiments herein may feature both steady state and transient sensitivity that are low, reduce gain sensitivity to load composition and inertial changes, and use low gains to save fuel, reduced engine wear, and reduce sensitivity to load composition changes. Further, embodiments described herein are insensitive to poles or zeroes movement in the mechanical drive train, or in the electrical power system.

The phrases "coupled to," "connected to," and "in communication with" refer to any form of interaction between two or more components, including mechanical, electrical, magnetic, and electromagnetic interaction. Two components may be connected to each other, even though they are not in direct contact with each other, and even though there may be intermediary devices between the two components.

As used herein, the term intelligent electronic device (IED) may refer to any microprocessor-based device that monitors, controls, automates, and/or protects monitored equipment within a system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, motor drives, and the like. IEDs may be connected to a network, and communication on the network may be facilitated by networking devices including, but not limited to, multiplexers, routers, hubs, gateways, firewalls, and switches. Furthermore, networking and communication devices may be incorporated in an IED or be in communication with an IED. The term IED may be used interchangeably to describe an individual IED or a system comprising multiple IEDs.

Aspects of certain embodiments described herein may be implemented as software modules or components. As used herein, a software module or component may include any type of computer instruction or computer-executable code located within or on a computer-readable storage medium, such as a non-transitory computer-readable medium. A software module may, for instance, comprise one or more physical or logical blocks of computer instructions, which may be organized as a routine, program, object, component, data structure, etc., that perform one or more tasks or implement particular data types, algorithms, and/or methods.

A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media. Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network.

The embodiments of the disclosure can be understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments. In addition, the steps of a method do not necessarily need to be executed in any specific order, or even sequentially, nor need the steps be executed only once, unless otherwise specified.

FIG. 1 is a block diagram of an electric power delivery system 100 including an intelligent electronic device (IED) 102 for controlling a prime mover of a machine (e.g., a generator 114).

Electric power delivery systems have been designed for the safe and reliable generation, transmission, and distribution of electric power to consuming loads. The electric power delivery system 100 comprises various equipment such as the one or more electric power generators, buses, transmission lines, transformers, smart distribution nodes, distribution lines, and the like for generating, transmitting, and delivering energy to a load 136.

Adding the IED 102 that is capable of controlling the generator 114 using energy packets may result in fast and reliable power output changes in response to a load change. While the illustrated embodiment includes the IED 102 that performs energy packet measurements, frequency control, and power reference signal calculations for controlling the generator 114, in some embodiments, these functions may be performed by three separate IEDs. In some embodiments, the electric power delivery system 100 may include an IED that performs a subset of these functions.

The IED 102 may comprise a power sensor 108, a processor 106, a frequency sensor 104, a communication interface 110, and a storage media 120. A system bus may facilitate communication and/or interaction between the components. The IED 102 may control the generator 114 based on energy packet measurements.

The IED 102 may obtain power system signals from portions of the electric power delivery system 100 either directly (as illustrated) or indirectly from various devices such as merging units. Electric power system signals may be obtained using instrument transformers such as a plurality of current transformers (CTs) 118, potential transformers (PTs) 116, and the like. The IED 102 may use power system signals such as signals representing current and voltage to determine a power of the generator 114.

The IED 102 may be configured to track energy packet changes by monitoring operating conditions of the generator 114.

The communication interface 110 may facilitate communications with various other devices either directly or via a network. For example, the communication interface 110 may facilitate communications with the generator 114. Suitable networks for configuration and/or use as described herein include one or more local area networks, wide area networks, metropolitan area networks, Internet or IP networks, such as the World Wide Web, a private Internet, a secure Internet, a value-added network, a virtual private network, an extranet, an intranet, or even stand-alone machines which communicate with other machines by physical transport of media. In particular, a suitable network may be formed from parts or entireties of two or more other networks, including networks using disparate hardware and network communication technologies. One suitable network includes a server and several clients; other suitable networks may contain other combinations of servers, clients, and/or peer-to-peer nodes, and a given computer system may function both as a client and as a server.

The IED 102 may include the processor 106 for executing instructions. The processor 106 may be implemented as a field-programmable gate array (FPGA), microprocessor, application specific integrated circuit, or the like.

The storage media 120 may be a repository for computer instructions, stored as the modules 112, to be executed by the processor 106, data 122, settings, samples, and the like. The storage media 120 may include a single or multiple physical storage media, one or more of which may be packaged with the processor 106. The storage media 120 may include, but is not limited to: hard drives, floppy diskettes, optical disks, CD-ROMs, DVD-ROMs, ROMs, RAMs, EPROMs, EEPROMs, magnetic or optical cards, solid-state memory devices, or other types of media/computer-readable media suitable for storing electronic instructions.

The data 122 may include data from the power sensor 108, frequency sensor 104 and data generated by the IED 102 (e.g., an energy packet measurement 130), such as by the modules 112 or other modules. The data 122 stored may be organized as one or more memory registers/addresses, files, and/or databases. The data 122 may include the energy packet measurement 130, a frequency measurement 132, and a power measurement 134.

The modules 112 may include an energy packet control 124, a frequency control 126, and a fuel valve calculator 128. The modules 112 may run multiple operations serially, concurrently or in parallel. The energy packet control 124 calculates energy packets associated with the generator 114, and converts the energy packets into a fuel valve reference. The frequency control 126 receives system feedback associated with the generator 114 such as the frequency measurements 132 or power measurements 134, and generates a frequency correction based on the system feedback. In some embodiments, the frequency control 126 may comprise a governor or an automatic generation control. The frequency correction is generated to drive an error between present frequency and target frequency to zero. The fuel valve calculator 128 may add the fuel valve reference and the frequency correction to determine a prime mover power reference, and provide the prime mover power reference to a fuel valve control of the generator 114 via the communication interface 110. The fuel valve control adjusts a throttle of the generator 114 according to the prime mover power reference. In some embodiments, the fuel valve calculator 128 may be an adder to simply sum the two outputs of the frequency control 126 and the energy packet control 124. In some embodiments, the fuel valve calculator 128 may include a converter to convert the outputs into compatible forms and then combine the converted outputs.

Figure 2:
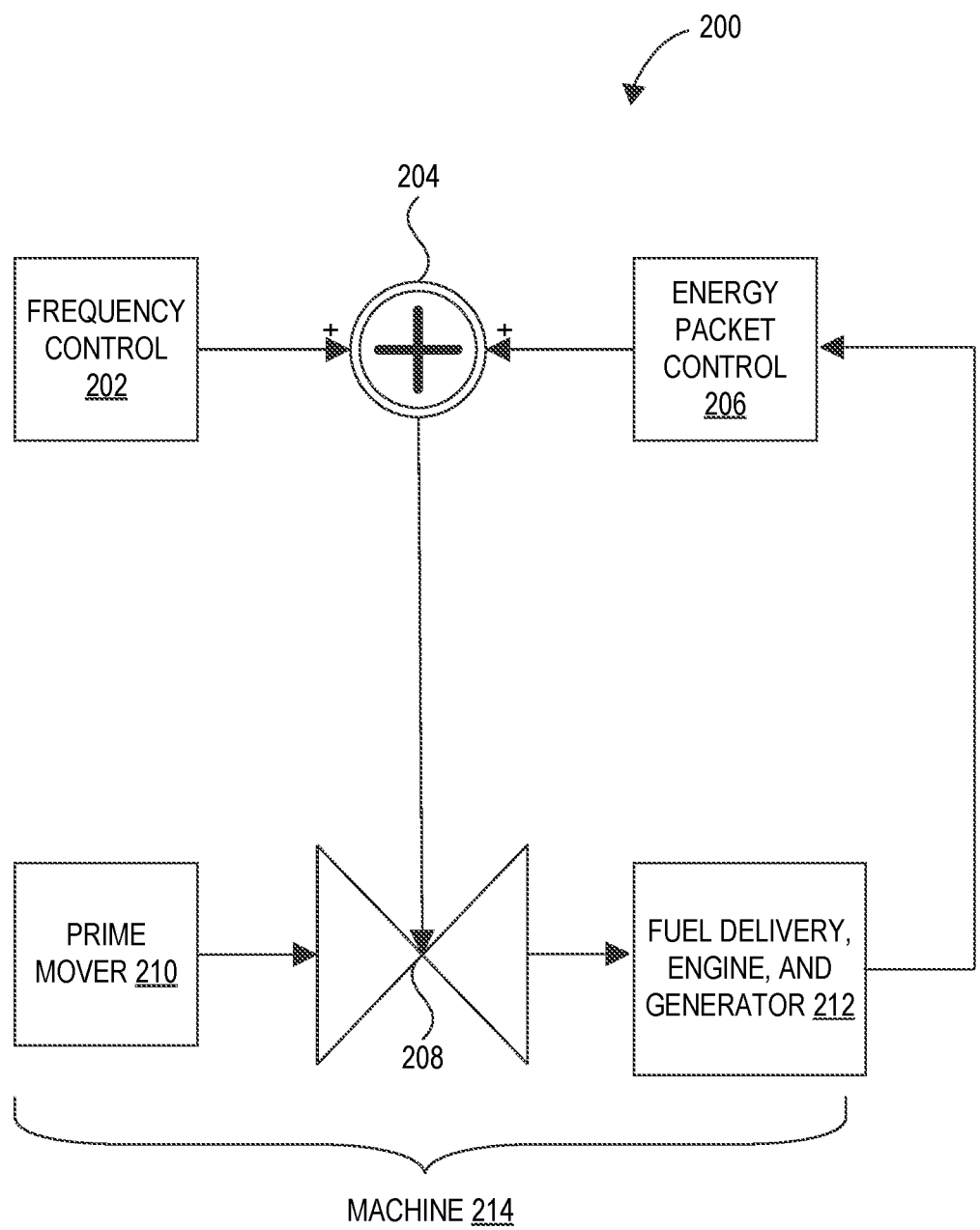
FIG. 2 illustrates a control system in accordance with one embodiment.

FIG. 2 is a schematic block diagram of a control system 200 for a prime mover of a machine, according to a first embodiment. The control system 200 illustrates a possible implementation of the TED 102 of FIG. 1. The control system 200 comprises a frequency control 202, an adder 204, and an energy packet control 206. The control system 200 may provide input to a fuel valve control 208 to control a prime mover 210, and a fuel delivery, engine and generator 212 of a machine 214. The prime mover 210 is a fuel source controlled driver of the machine 214. The input from the control system 200 may cause a throttle to increase fuel delivery to increase the power or reduce fuel delivery to decrease the power.

The energy packet control 206 receives power samples which may include the voltage measurements and current measurements of the machine 214. The energy packet control 206 measures energy in the form of energy packets. The energy packet control 206 may calculate energy packets using principles detailed below in reference to FIG. 4 and FIG. 5. The energy packet control 206 may convert the calculated energy packets from the energy value to a fuel valve reference signal compatible with the fuel valve control 208 to indicate a change in fuel based on the current energy packet measurement. Additional details regarding the conversion are discussed with reference to FIG. 4. The converted energy packet measurement may be fed unfiltered into a fuel valve calculator such as the adder 204 to generate a prime mover power reference. The fuel valve reference signal from the energy packet control 206 provides fast advanced notification of the changing load conditions (e.g., no need to wait for speed change to act), thereby reducing the frequency deviations under changing load conditions.

The frequency control 202 may compensate for residual frequency errors by receiving system feedback associated with the monitored machine, and generating a frequency correction based on the system feedback. The frequency correction and the fuel valve reference signal from the energy packet control 206 are added together by the adder 204 to produce the prime mover power reference which is sent to the fuel valve control 208 to indicate a new throttle rate at which the fuel valve control 208 is to control the prime mover 210. The energy packet control 206 updates the fuel valve reference signal faster than the frequency control 202 updates the frequency correction. However, the frequency correction may be more accurate than the fuel valve reference signal from the energy packet control 206. Thus, the control system 200 combines the fast feedback loop of the energy packet control 206 and the slower feedback loop of the frequency control 202 to quickly and accurately control the machine 214 under changing load conditions.

The frequency control 202 may comprise a traditional governor and/or automatic generation control. Frequency errors and adjustment of power setpoints may be corrected using the traditional governor and/or automatic generation control. Governors are often droop-based, which facilitates parallel generator operation. With a droop method, the error between a target nominal frequency and the present measured frequency may not be fully corrected. Instead, the frequency declines as power demands increase. Thus, a second error correction stage may include an automatic generation control stage that may measure system frequency at a common point between all machines and run in a slow loop to drive the error between present frequency and target frequency to zero. The automatic generation control stage may also take other inputs such as power flow across certain lines and generate signals suitable to bring these inputs in line with target values as well.

Figure 3:
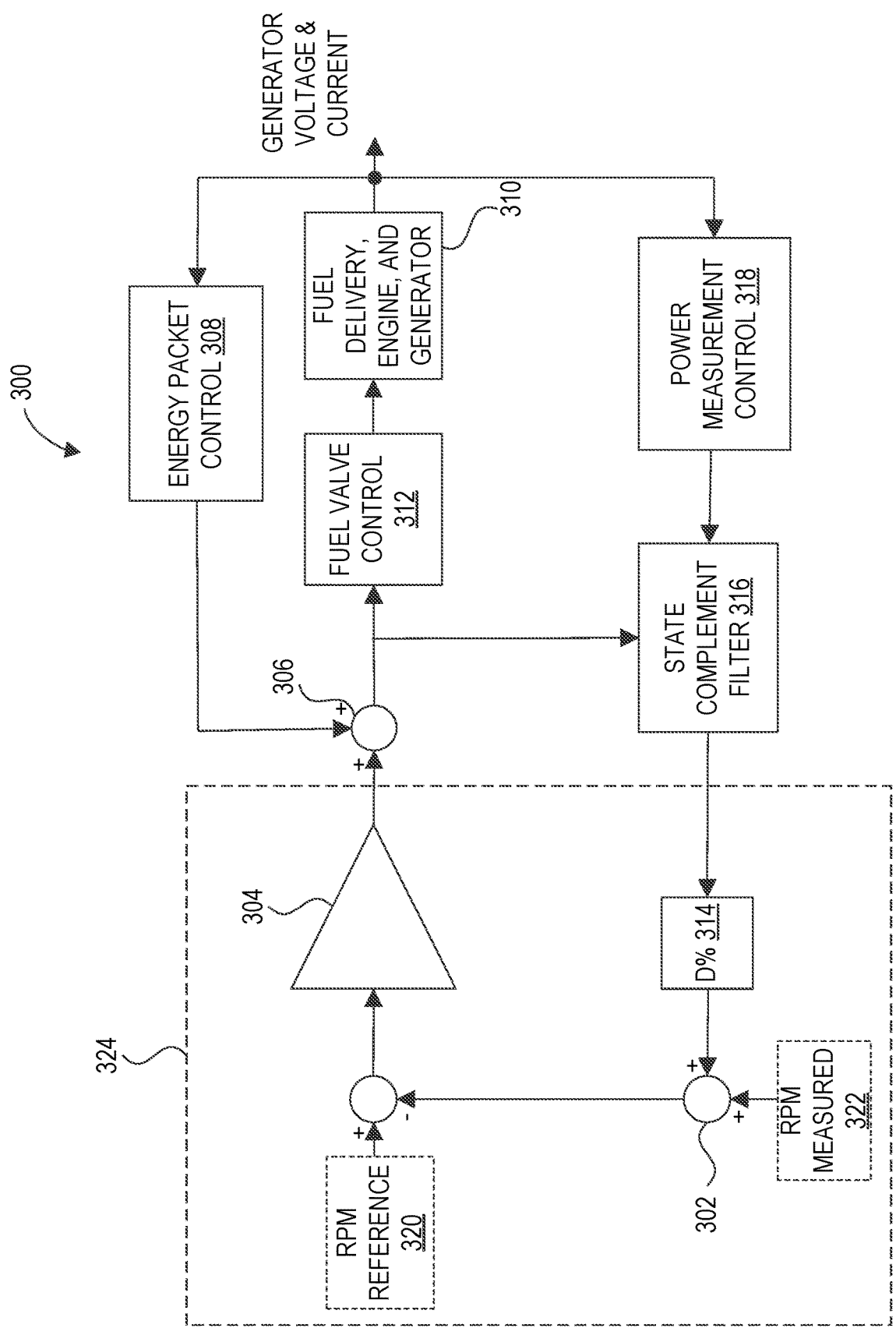
FIG. 3 illustrates a control system in accordance with one embodiment.

FIG. 3 is a schematic block diagram of a control system 300 for a machine, according to another embodiment. The control system 300 illustrates a possible implementation of the TED 102 of FIG. 1. The control system 300 may provide input to a fuel valve control 312 to control a fuel delivery, engine, and generator 310. The input from the control system 300 may cause a throttle to increase fuel delivery to increase the power or reduce fuel delivery to decrease the power. The control system 300 comprises an energy packet control 308; a proportional gain control 324; a state complement filter 316; and a power measurement control 318.

The energy packet control 308 receives power samples which may include the voltage measurements and current measurements of the electrical system. The energy packet control 308 measures energy in the form of energy packets. The energy packet control 308 may calculate energy packets using principles detailed in reference to FIG. 4 and FIG. 5. The energy packet control 308 may convert the calculated energy packets from the energy value to a fuel valve reference signal compatible with the fuel valve control 312 to indicate a change in fuel based on the current energy packet measurement. Additional details regarding the conversion are discussed with reference to FIG. 4. The converted energy packet measurement may be fed unfiltered into a fuel valve calculator such as a first adder 306 to generate a prime mover power reference. The fuel valve reference signal from the energy packet control 308 provides fast advanced notification of the changing load conditions (no need to wait for speed change to act), thereby reducing the frequency deviations under changing load conditions.

The power measurement control 318 measures the power of the fuel delivery, engine, and generator 310. In some embodiments, the power measurement control 318 may compute the three-phase, electrical phasor-based power of the fuel delivery, engine, and generator 310 continuously.

The state complement filter 316 receives the prime mover power reference from the first adder 306 and the power measurement from the power measurement control 318. The state complement filter 316 blends the received values to output a blended power feedback. In some embodiments, the state complement filter 316 comprises a high-pass filter and a low-pass filter. For instance, the state complement filter 316 may pass the prime mover power reference (output of the summation) through a high-pass filter, and the output of the power measurement control 318 through a low-pass filter similar to a traditional complementary filter. The filters can be matched so that the summation of their response has unity gain over all frequencies. The state complement filter 316 may add the outputs of these two filters together to provide power feedback for a droop signal. In another embodiment, a Kalman filter may be employed where the measurement error covariance matrix is dynamically adjusted based on the frequency distribution of the measured signals. That is, during a transient, the variance of the power measurement is increased and the variance of the prime mover power reference is decreased.

The state complement filter 316 can provide advantages of both valve droop and metered power droop, without the transient side effects. The fast anticipatory power fuel valve reference gives fast droop response and thus minimizes oscillations. The slower but very accurate power measurement linearizes the errors associated with a valve droop signal. In one embodiment the state complement filter 316 step response is set at default of ~10 seconds, that is, following a transient, the state compliment filter takes ~10 seconds to seamlessly transition the control signal from the fast anticipatory power fuel value reference to the slower power measurement.

In some embodiments, the state complement filter 316 may be replaced with another filter. For example some embodiments may use a filter with a basic weighted summation (e.g., half the valve reference plus half the measured power output). In some embodiments, an advanced weighted summation where the two gains (i.e., factors to multiply with the valve reference and the measured power output) are based on a dynamic model and a plurality of machine measurements and control signals. In some embodiments, a Kalman filter may be used. The Kalman filter can use a state-space model of the dynamic system and characterizations of the measurement and process noise levels to provide a best estimate of an element of the system state. In some embodiments, the power references need not be limited to these two measurements (e.g., valve reference and the measured power output). A state complement filter can take any number of inputs related to the machine state and/or control signals and generate an improved signal for droop calculation.

The droop control 314 (a form of frequency control) is in communication with the state complement filter 316. A droop control 314 receives the blended power feedback from the state complement filter 316 and applies a droop factor to the blended power feedback to output a droop power feedback. The droop control 314 specifies a droop rate. In some embodiments, the droop is set by default to 4% of the full load of the fuel delivery, engine, and generator 310. However, with the control system 300, engines can be set at very low droops (lower than 1%) without stability issues. All gains (e.g., proportional gain related to droop rate) can be set using per unit quantities, eliminating the complexities of unit translation when the controls are moved between generators. The default 4% droop (proportional gain=25) is typically maintained as this provides resiliency to a power measurement failure. If measurement of power is lost, the control system 300 reverts to proportional control maintaining stability and droop characteristic.

The proportional gain control 324 uses the droop power feedback to generate a frequency correction for the prime mover power reference. The frequency correction is added to the converted energy packet measurement from the energy packet control 308 by the first adder 306 to generate the prime mover power reference for the fuel valve control 312.

To generate the frequency correction, the proportional gain control 324 uses an RPM outer loop control. The RPM outer loop control is used as this has been shown in the field, mathematically, and through modelling as having the least sensitivity to changing load compositions. As shown, the proportional gain control 324 uses a second adder 302 to add a revolutions per minute (RPM) measurement 322 and the droop power feedback. An RPM reference 320 is reduced by a sum of the second adder 302 via a subtractor. An amplifier 304 applies a gain to the difference of the RPM reference 320 and the sum of the second adder 302 to generate the frequency correction.

In some embodiments, non-linear mapping of the fuel valve is accomplished in the fuel valve control 312. This allows a single P gain to work for machines of all power level ratings. Many governors have non-linear P gains to compensate for these effects. This complexity is unnecessary with the control system 300. Non-linearities, deadbands, and hysteretic behavior in the fuel valve, fuel delivery, engine, and generator which aren't mapped out by the fuel valve control 312 are compensated by the P gain. The controller is a proportional (P) only controller. In some embodiments the P is set at default of 25 for all engines. This provides control redundancy as the standard 4% natural droop will result if the energy packet feedback term is lost for some reason.

The RPM Input is set based on the target frequency of the power system plus a scaled target power output of the machine. For example, for a machine with a 4% droop, 60 Hz target frequency, and 0.5 per-unit expected nominal power output, the RPM Input is set to 60*(1 [pu freq]+0.5 [pu power]*0.04 [pu freq/pu power])=61.2 Hz. Then, convert this to RPM based on the number of machine poles, RPM Input=60 [sec/min]*61.2 [poles/sec]/(number-of-poles/2 [poles/sec]) revolutions per minute.

Figure 4:
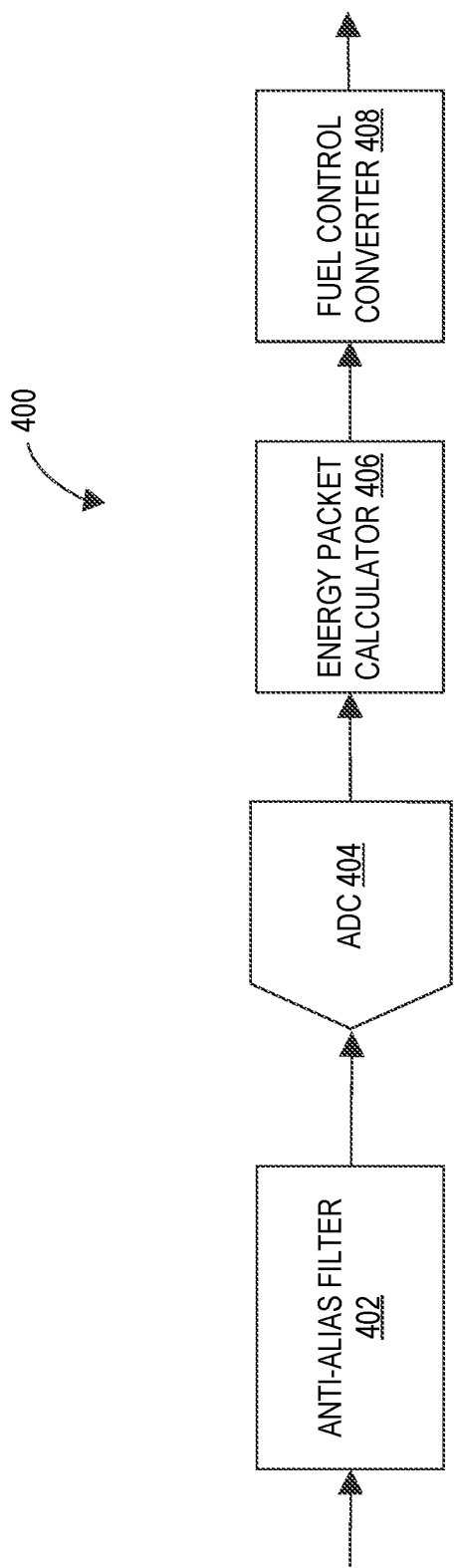
FIG. 4 illustrates an energy packet control in accordance with one embodiment.

FIG. 4 shows a block diagram of an energy packet control 400, according to one embodiment. The energy packet control 400 is a detailed block diagram of one embodiment of the energy packet control 124 of FIG. 1, the energy packet control 206 of FIG. 2, and/or the energy packet control 308 of FIG. 3. The energy packet control 400 comprises an anti-alias filter 402, an ADC 404, an energy packet calculator 406, and a fuel control converter 408.

The energy packet control 400 receives sample voltages and currents of the power system. The anti-alias filter 402 restricts the bandwidth of the samples over a band of interest. After the anti-alias filter 402, the ADC 404 samples power system voltages and currents at a fixed rate. The ADC 404 sample rate is based on the Nyquist frequency for the voltages and currents.

In one embodiment, the energy packets are time-stamped according to a common time reference. In this embodiment, for example a GPS time code signal is connected to the ADC 404. The embodiments of the generation control described in this patent do not require the time-stamp, common time reference, or coordination of sampling between the energy packet controlled machines in the power system.

The energy packet calculator 406 may be configured to calculate energy packets, such as discrete time energy packets illustrated and described below. Energy packets capture the full spectrum of the signal and are applicable for both sinusoidal steady-state and nonstationary conditions. Over each time interval, the energy packet calculator 406 may compute the energy from measurements of voltage and current. The fixed interval does not depend on any estimated power system quantity such as fundamental frequency. In this way, an energy packet is a time-domain concept. The energy packet calculator 406 may calculate energy packets flowing past the IED 102 using principles detailed below.

Equation 1 defines the continuous-time energy packet $\varepsilon(t)$ from voltages $v(\sigma)$ and currents $i(\sigma)$:

$$\varepsilon(t) = \int_{t-T}^{t} v(\sigma) i(\sigma) d\sigma \qquad \text{Eq. 1}$$

Equation 2 defines the three-phase energy packet $\varepsilon_3(t)$. In Equation 8, the integration interval is over the same time interval for all three phases. This equation includes the possibility of unbalanced three-phase operation.

$$\varepsilon_3(t) = \int_{t-T}^{t} [v_{a\text{-}phase}(\sigma) i_{a\text{-}phase}(\sigma) + v_{b\text{-}phase}(\sigma) i_{b\text{-}phase}(\sigma) + v_{c\text{-}phase}(\sigma) i_{c\text{-}phase}(\sigma)] d\sigma \qquad \text{Eq. 2}$$

Equation 3 defines the discrete-time energy packet $\varepsilon[n]$, where it is appreciated that the product of the voltage (e.g., in J/c) and current (e.g., in c/s) is power (e.g., in J/s). The value $T_S$ is the data sample period, and M represents to factor for down sampling:

$$\varepsilon[n] = T_s \sum_{m=M(n-1)+1}^{Mn} v[m] i[m] \qquad \text{Eq. 3}$$

where:
$\varepsilon^+[n]$ represents the positive energy packet value for sample n;
$\varepsilon^-[n]$ represents the negative energy packet value for sample n;
$T_s$ represents the data sample period;
M represents a factor for downsampling;
v[m] represents a voltage value at sample m; and,
i[m] represents a current value at sample m.

The notation for a discrete-time quantity is with hard brackets: $v[m] \equiv v(mT_s)$. Equations 1-3 place no constraint on the values of T or $T_S$. Thus, energy packets are frequency independent.

In some embodiments, the system uses the three-phase equation. In one embodiment, the system uses the three-phase equation directly. In another embodiment, the system filters to remove noise or energy oscillations due to unbalanced conditions. In another embodiment, the system uses the Clarke transformation of the three-phase energy packet.

After calculating the energy packet, the fuel control converter 408 maps the calculated energy packet to a prime mover power reference signal. This is a mapping from the energy value to a signal that is input to a fuel valve control to cause the Fuel Delivery, Engine, and Generator to output energy matching the energy packet measurement for the current interval. The output signal of the fuel control converter 408 may be designed to be unit compatible with the output of a proportional gain circuit.

In some embodiments, the fuel control converter 408 converts the calculated energy packet with a mathematical model of the machine used to generate a table of values. In one column of the table is the energy packet value and in a second column of the table is the Fuel Control Conversion output signal value associated with that measured energy packet value. For intermediate energy packet values, the fuel control converter 408 may use interpolation to determine the output signal. Another method for the fuel valve control 208 to build the table is with machine measurements, and comparing the energy packet measurements with an associated signal applied at the input of the Fuel Valve Control. Finally, another method for the fuel valve control 208 to build the table is with a linear relationship between the energy packet value and the Fuel Control Conversion output signal. The offset and gain of the linear relationship may be determined either with a mathematical model or with measurements.

In some embodiments, the fuel control converter 408 may be replaced with a differentiation block. Changes in the load, as measured with energy packets, acts as a fast adjustment to the machine prime mover. In some embodiments the fuel control converter 408 is a one-to-one direct map, where the value of the energy packet signal directly and proportionally controls the valve.

Figure 5:
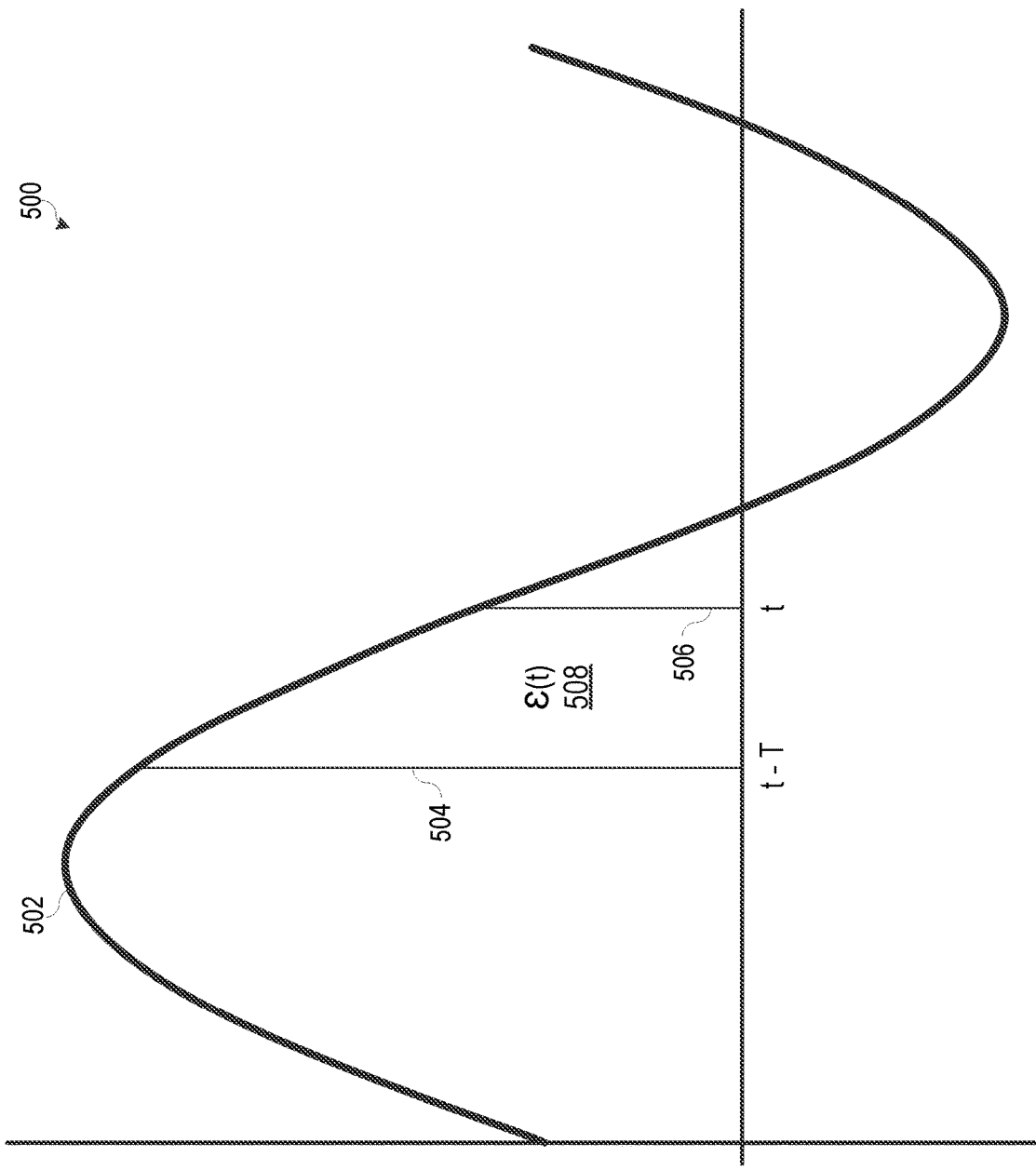
FIG. 5 illustrates a plot in accordance with one embodiment.

FIG. 5 illustrates a plot 500 of an instantaneous product of voltage and current 502 over time. An energy packet 508 is bounded at a time 504 and time 506. The positive energy packet 508 is calculated for the continuous-time case. The integration interval (Equation 1) covers from the present time and then back seconds to the previous time.

Figure 6:
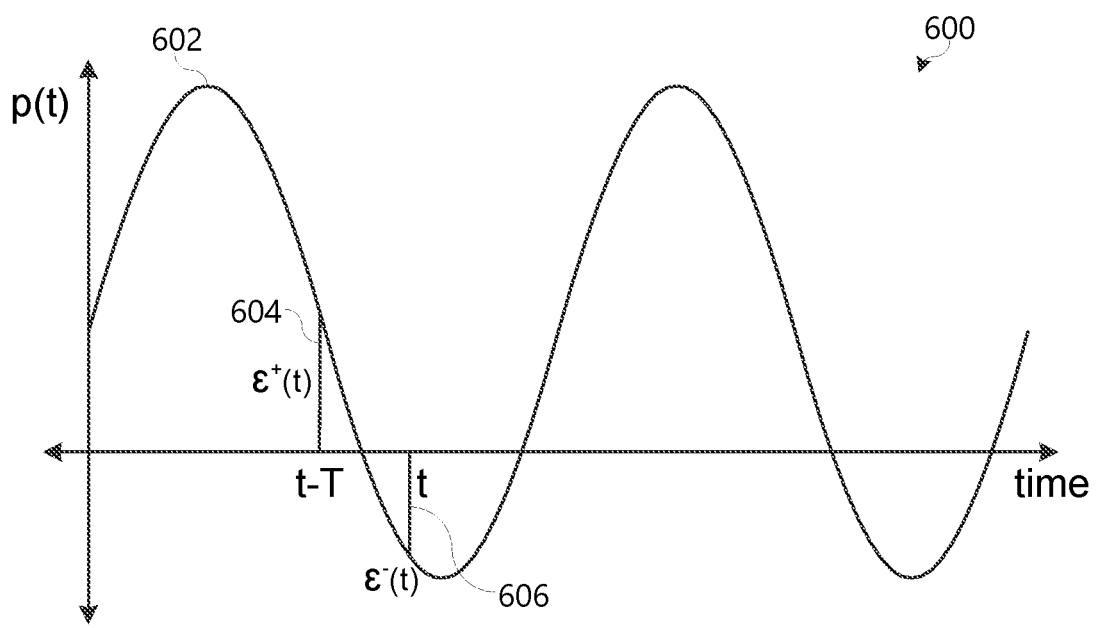
FIG. 6 illustrates another plot of a product of voltage and current over time including an energy packet interval in accordance with one embodiment.

FIG. 6 illustrates a plot 600 of an instantaneous product of voltage and current 602 over time, where the integration interval from 604 (at time t−T) to 606 (at time t) includes power flowing in both directions. In this case two separate intervals are computed, one for energy flowing in the positive direction $\varepsilon^+$ and one for energy flowing in the opposite, or, negative, direction, $\varepsilon^-$. This algorithm easily extends to an arbitrary number of zero crossings over the integration interval. In various embodiments, the total of all power flowing in the positive direction may be combined for energy packet $\varepsilon^+$ and the total of all power flowing in the negative direction may be combined for energy packet $\varepsilon^-$. Both packets may be reported for the same time instant t and for the same interval t−T.

The separation into positive and negative regions is given mathematically as follows in Equations 4 and 5, for the discrete-time case:

$$\varepsilon_a^+[n] = T_s \sum_{m=M(n-1)+1}^{Mn} \begin{cases} v[m]i[m]; & v[m]i[m] > 0 \\ 0; & \text{otherwise} \end{cases} \quad \text{Eq. 4}$$

$$\varepsilon_a^-[n] = T_s \sum_{m=M(n-1)+1}^{Mn} \begin{cases} v[m]i[m]; & v[m]i[m] < 0 \\ 0; & \text{otherwise} \end{cases} \quad \text{Eq. 5}$$

For illustration, it is convenient to show continuous-time waveforms as in FIGS. 5 and 6. However, the energy packets are typically implemented (calculated and used) with the discrete-time approach as shown in Equations 4 and 5. Energy packets for multiple phases, such as three phases, may be calculated as a summation of Equation 4 over all three phases and a separate summation of Equation 5 over all three phases. The three-phase energy packet calculation is a summation of the energy for each phase as shown in Equation 6:

$$\varepsilon[n] = \varepsilon_a[n] + \varepsilon_b[n] + \varepsilon_c[n] \quad \text{Eq. 6}$$

Figure 7:
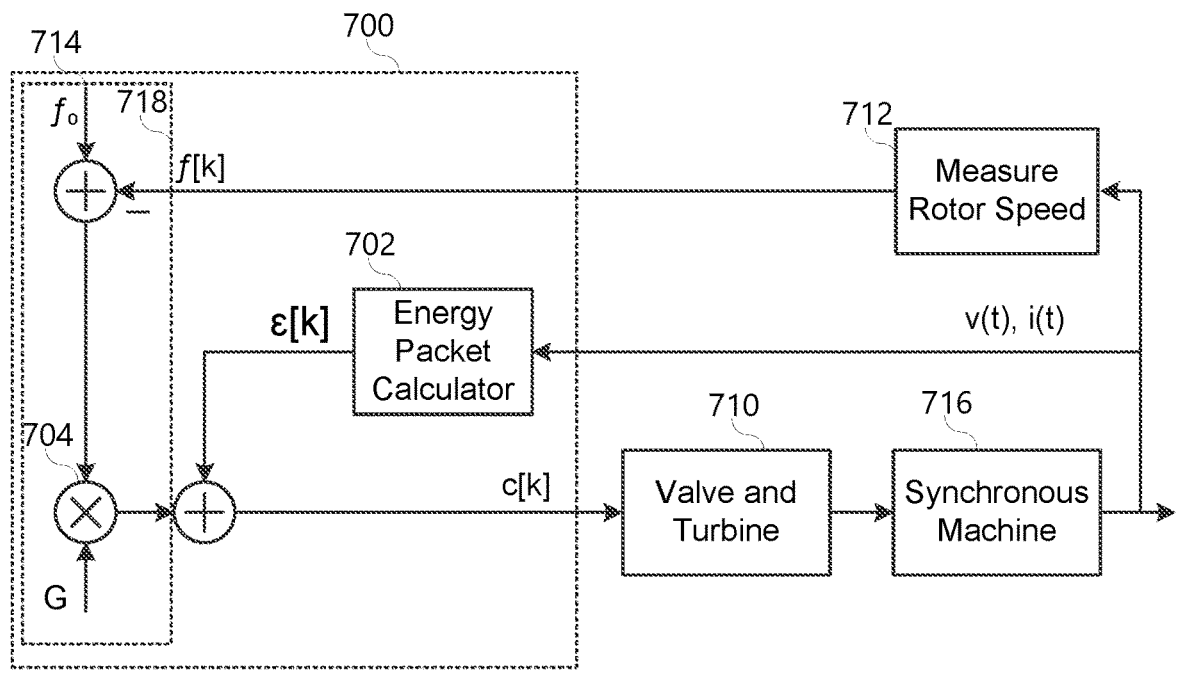
FIG. 7 illustrates an energy packet controller in accordance with one embodiment.

FIG. 7 illustrates one embodiment of an energy packet controller 700. In this embodiment, the energy packet controller 700 is a direct feedback scheme with a proportional gain term. In this embodiment there are no PID loops to tune. A prime mover 710 and synchronous machine 716 may be controlled by the energy packet controller 700.

The energy packet controller 700 includes an energy packet calculator 702 and a gain element 704. The energy packet calculator 702 computes the energy packets. For example, the energy packet calculator 702 may use equation 3 to solve for energy packets for a three phase system as follows: calculate equation 3 for the a-phase voltage and current, then calculate equation 3 for the b-phase voltage and current, then calculate equation 3 for the c-phase voltage and current, then add all three results together to get the energy packet value for the combined three phase system.

The output of the energy packet calculator 702 may be added to a frequency difference. A frequency controller 718 may determine the frequency difference for setpoint feedback control. The frequency difference may be determined by the energy packet controller 700 by subtracting a measured rotor speed 712 from a reference frequency 714 for setpoint feedback. The gain element 704 may introduce a single gain term. The gain term may be set to 25 in some embodiments.

Figure 8:
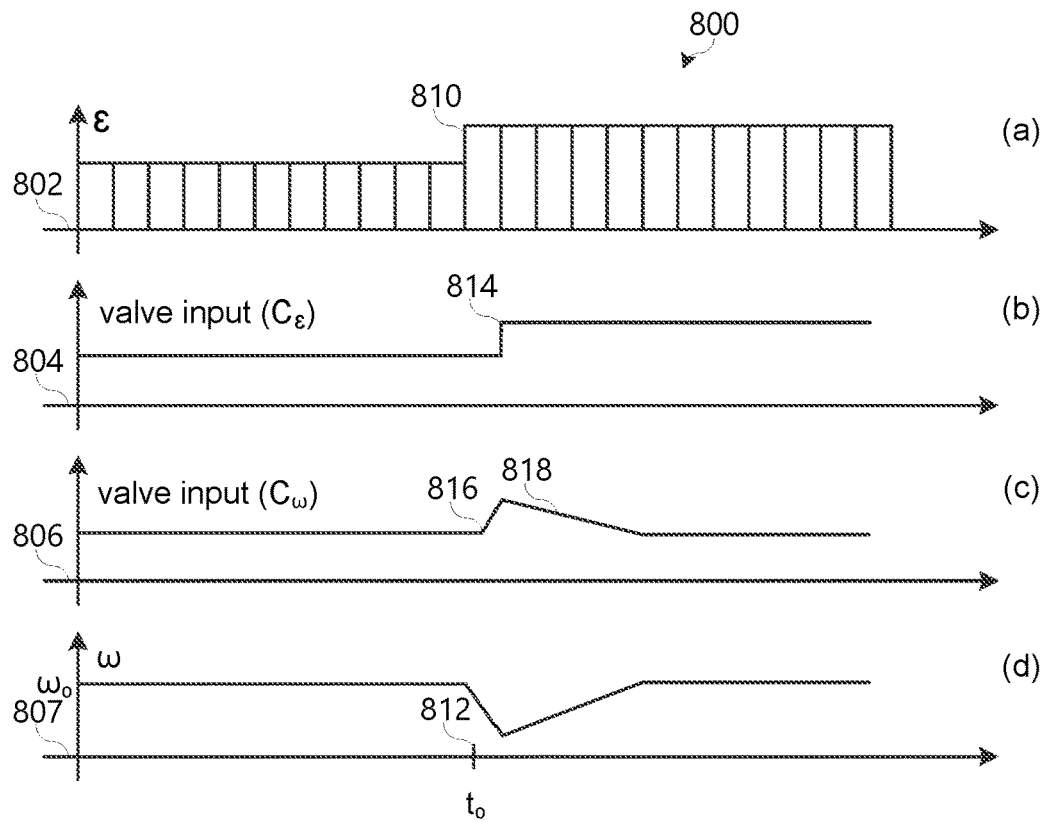
FIG. 8 is a series of plots to illustrate an energy packet controller principle of operation.

FIG. 8 is a series of plots 800 to qualitatively illustrate an energy packet controller principle of operation. In plot (a) 802, each rectangle represents a calculated energy packet. The next two plots, plot (b) 804 and plot (c) 806, show the turbine valve control input due to the energy packet component of the control signal, $c_\varepsilon$ (output of 802), and due to the frequency difference component of the control signal, $c_\omega$ (output of 804), respectively. The combination of these two values results in the total signal for changes to the valve, c (input to 810).

$$c[n] = c_\varepsilon[n] + c_\omega[n] \quad \text{EQ. 7}$$

Plot (d) 808 is the rotor speed, $\omega = 2\pi f$.

When power system experiences a step load increase at time $t_o$, energy packets measure this increase, as shown at the time 810. Due to various latencies, the rotor speed in the illustrated embodiment declines, in accordance with the step load increase at the time 812. The feedback control loop with energy packets results in an increase in the valve input signal at the time 814. Also, due to the frequency control loop, the valve input increases to compensate at point 816. Finally, the frequency offset is corrected back to nominal along slope 818. The total valve signal may be the summation of the signals in plot (b) 804 and plot (c) 806.

The balance between mechanical and electrical conditions is corrected by the energy packet control loop at the time 814. This happens without any need for integration and without a slow inertially constrained swing equation. The energy packet controller effectively removes the load as a disturbance leaving the frequency proportional term to return to a zero steady-state error condition. Precisely measuring imbalances and applying them to control the prime mover is a characteristic of the energy packet approach.

Energy packets provide the ability to compute over fixed intervals, independent of frequency or phase angles. The energy packets are not averaged quantities. An energy packet may measure the amount of joules transferred over a specific interval of time. This makes the energy packets suitable for direct control over the prime mover input.

Figure 9:
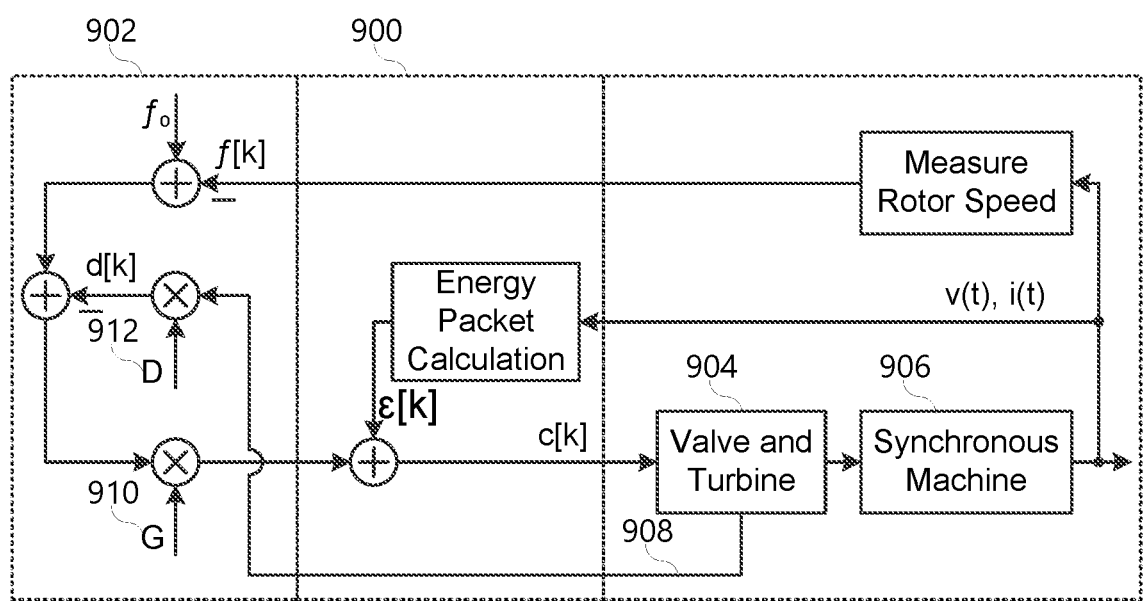
FIG. 9 illustrates a simple model of the energy packet controller, prime mover, synchronous machine, and electric power system in accordance with one embodiment.

FIG. 9 illustrates an energy packet controller 900 in combination with a valve reference frequency controller 902 to control a prime mover 904 and a synchronous machine 906. To intentionally create a linear droop response, an additional control signal is added from a measurement of the valve position 908. The energy packet controller 900 may calculate the energy packets. For example, the energy packet controller 900 may use equations 3-6 to determine the energy packets.

In this embodiment, the frequency controller 902 is a traditional valve referenced drop controller. The frequency controller 902 uses the commanded valve position 908 as the reference for computing a droop signal. As illustrated, a PID portion of the traditional frequency controller is not required when energy packets are included. With the addition of energy packets, the integral term of the valve referenced frequency controller is no longer required.

To configure the energy packet controller 900 with intentional droop added, two gains (G 910 and D 912) may be included as shown in FIG. 9. Further simplifying the configuration, in some embodiments, a relationship between the two gains is G=1/D. So, for example, in a power system requiring 4% droop sharing between the machines, the frequency controller 902 may set D=0.04 and G=25. Using this relationship, even with the intentional addition of droop, the energy packet controller requires only one parameter.

EXAMPLE

The following example is illustrative of disclosed methods. In light of this disclosure, those of skill in the art will recognize that variations of these examples and other examples of the disclosed method would be possible without undue experimentation. FIGS. 10-16 illustrate testing models and results for embodiments described with reference to FIGS. 7-10.

Example 1—Test Models

Figure 10:
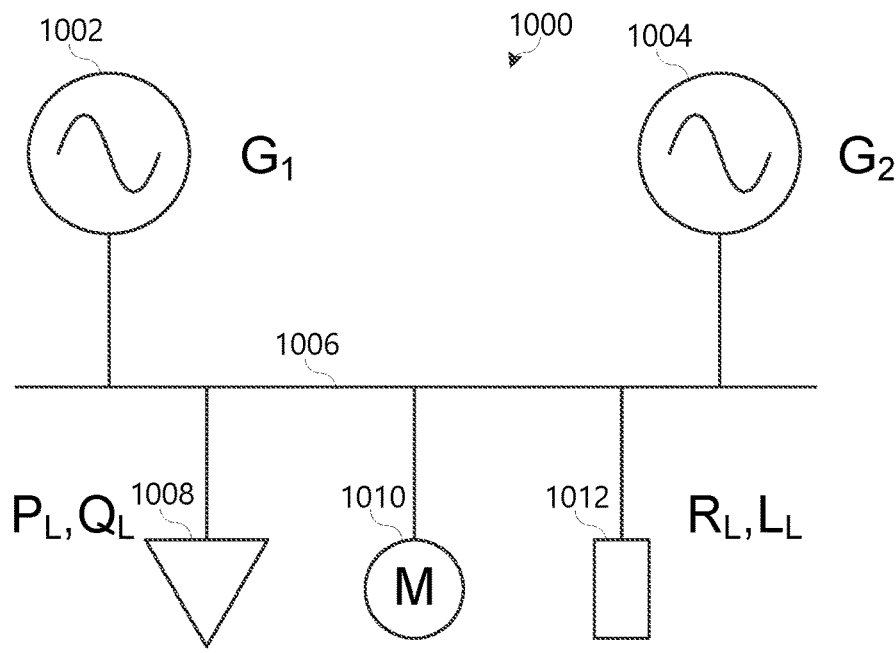
FIG. 10 illustrates an energy packet controller in combination with a frequency controller to control a prime mover and a synchronous machine in accordance with one embodiment.
Figure 11:
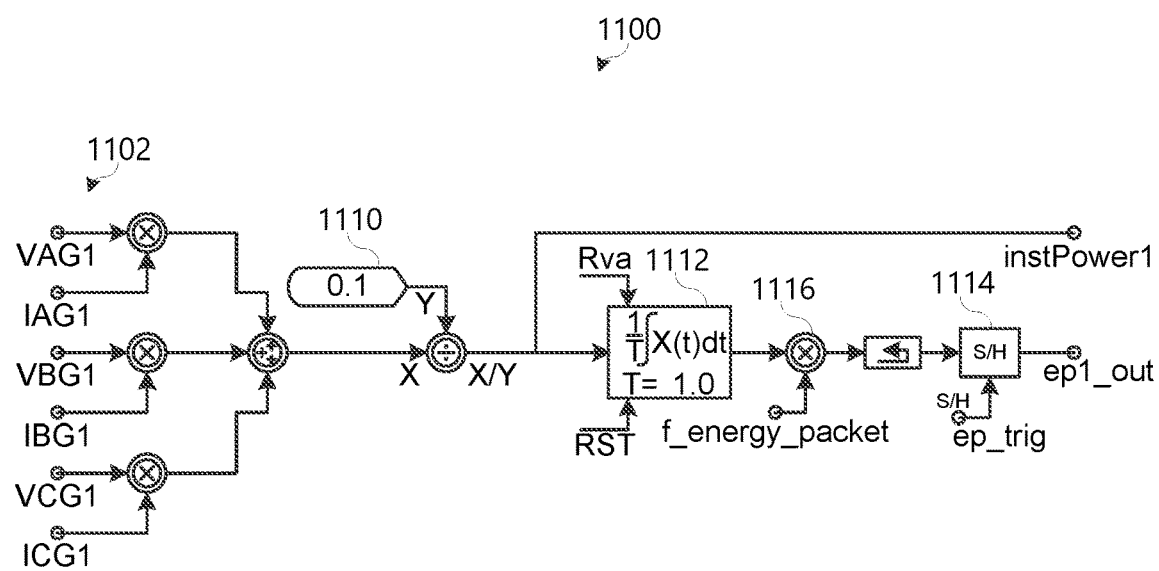
FIG. 11 illustrates a test system used to check the energy packet controller in accordance with one embodiment.

FIG. 11 10 illustrates a test system 11 1000 used to check the energy packet controller. In the illustrated embodiment, the test system 11 1000 is a small microgrid system. Microgrids are a particularly challenging environment for generation control because of the lower inertia and faster dynamics.

In the test, two generators (generator 11 1002 and generator 11 1004) are connected in parallel and through a common bus 11 1006 to a set of loads. For this test, each generator was modeled as a 100 kW fuel injected diesel machine. An engine control unit was not included in the tests. The control signal is to the main fuel valve and is not controlling individual fuel injections. Diesel machines are responsive to fast valve changes. In a larger turbine, the inertia of the valves can limit speed of movement, although fast valving techniques are available. The fuel transfer and turbocharger air compression delay, related to $T_E$, (FIG. 10 and Equation 8) is set at 200 milliseconds.

For this test, the bus voltage was set to 208 volts RMS. Three types of loads were connected to the bus 11 1006. The loads are a constant PQ load 11 1008, a motor 11 1010, and an RL circuit 11 1011. Each load was setup to draw 30 kW at equilibrium. The constant PQ load 11 1008 models an electronic system that very quickly adapts to changing electrical conditions, such that it attempts to always draw average power $P_L$. The load also attempts, in steady state, to drive load current such that the phase angle between voltage and current gives $Q_L$ as a steady-state reactive power quantity.

FIG. 11 is an energy packet calculation 1100 as implemented for simulator modeling. On the left, the machine terminal voltages and currents 1102 were multiplied and then summed. The division 1110 by 0.1 converts power from megawatts into per-unit. Next the result is connected to an integration and downsample step according to Equation 3. In FIG. 11, this is represented by the integration block 1112 and the sample and hold (S/H) block 1114. The multiplication 1116 by f_energy_packet compensates for the numerical integration interval of the simulation. In the simulations the integrator output an energy packet at one milliseconds intervals and f_energy_packet was set equal to 1000. The upper output is an instantaneous power signal, not used in these simulations. The lower output is the energy packet value.

Example 2—Test Results

Figure 12:
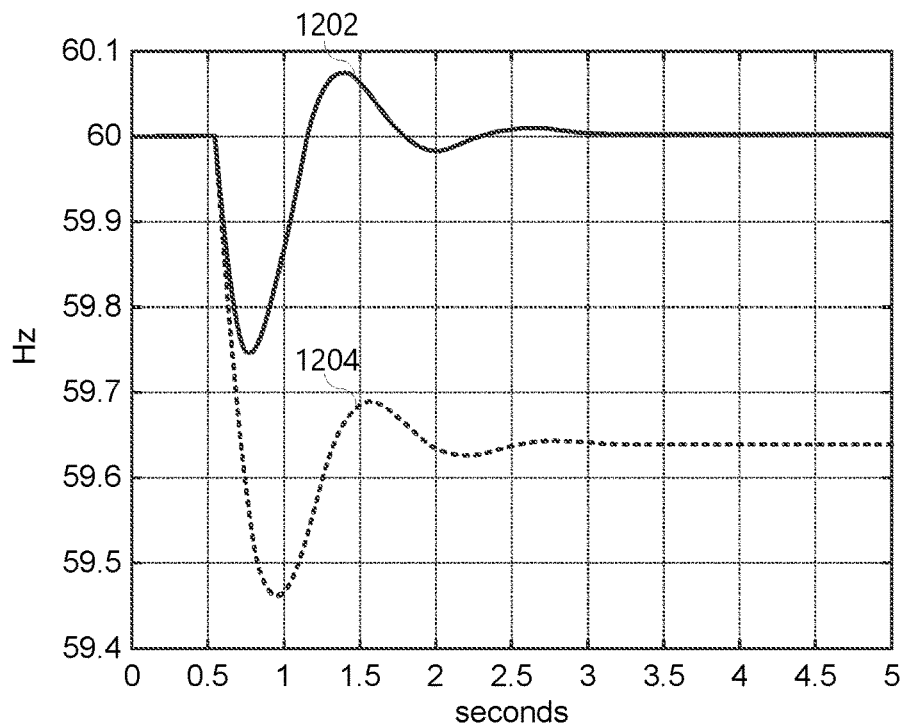
FIG. 12 is an energy packet calculation as implemented for simulator modeling in accordance with one embodiment.

FIG. 12 illustrates the results of a first test case in which a 30 kW RL load was added to an unloaded system. In FIG. 12, the energy packet controller is compared to a natural droop governor. The results include the frequency response of a natural frequency controller frequency response 1204 and an energy packet frequency response 1202. The natural droop gain was set to P=25 and for the energy packet controller the gain was set to G=25. The gain G was set equal to P to provide a fair comparison with traditional controllers.

The frequency response of adding the load is shown in FIG. 12. The energy packet controller rapidly returns and holds the frequency at nominal. This is without the integration function that causes stability problems for isochronous controllers.

Close examination of the post-disturbance energy packet-controlled frequency level reveals that it does not return exactly to the nominal frequency. This is because of small measurement errors. Also, the energy packet measurements are at the machine terminals and do not include machine losses. However, the resulting frequency error is small, and this significantly lowers the secondary control loop performance requirements. The result is a system that is faster, simpler, and overall more stable than a traditional controller. The frequency error of the traditional controller (natural frequency controller frequency response 1204) is much larger than that of the energy packet controller.

Both the energy packet controller and frequency controller return to their equilibrium points with similar dynamics. The large value of the frequency swing is due to the load change relative to this small test microgrid system. The ringdown length is sensitive to the fuel transfer delay for both controllers. The energy packet controller, although bringing the system much closer to nominal frequency, does not exhibit the hunting or stability problems that are common to an isochronous controller. The energy packet frequency response 1202 is damped to the same degree as the inherently stable natural droop response.

Figure 13:
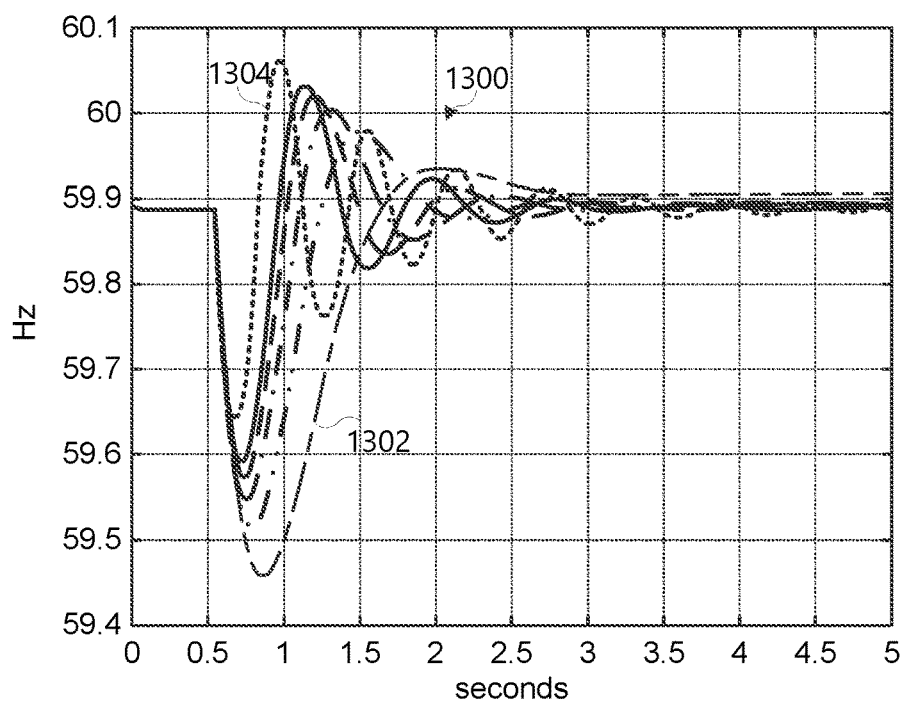
FIG. 13 illustrates the results of a first test case in which a 30 kW RL load was added to an unloaded system in accordance with one embodiment.

FIG. 13 illustrates energy packet responses 1300 to the load acceptance test of FIG. 13 (i.e., adding a 30 kW RL load to an unloaded system) for a range of the gain values G. More specifically, FIG. 13 shows the response as the parameter is varied from a value of 10 (slowest response 1302) to 100 (fastest response 1304). Increasing the gain improves the response time. For all gains the system is stable. A value of G=25 works well for almost all applications, making the energy packet controller effectively zero setting. No tuning of G is required.

Figure 14:
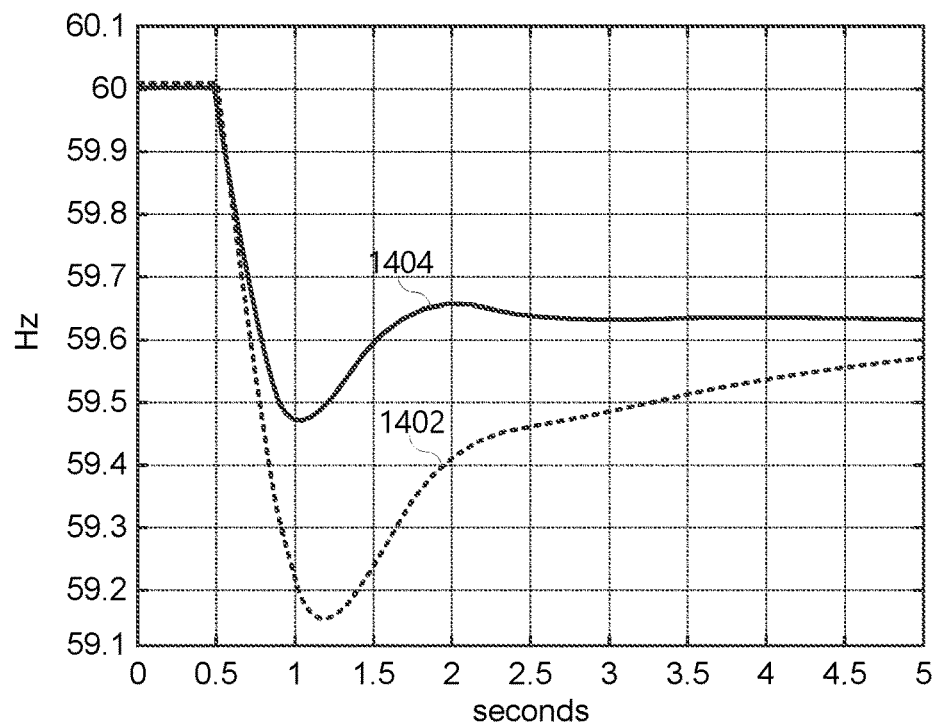
FIG. 14 illustrates energy packet responses to the load acceptance test of FIG. 14 for a range of the gain values G in accordance with one embodiment.

FIG. 14 illustrates test results for an energy packet controller with intentional droop added (e.g., FIG. 11). For this test, the system was initialized with the 30 kW RL load. After reaching steady state, the 30 kW motor was started. The results include a frequency response of a traditional valve referenced frequency controller 1402, and a frequency response of the energy packet controller 1404 with intentional droop added through the state complement filter. The droop gain of both controllers was 0.04. As shown, the frequency response of the energy packet controller 1404 exhibits significantly less overshoot than the frequency response of the traditional controller 1402 and goes rapidly to the target droop frequency.

Figure 15:
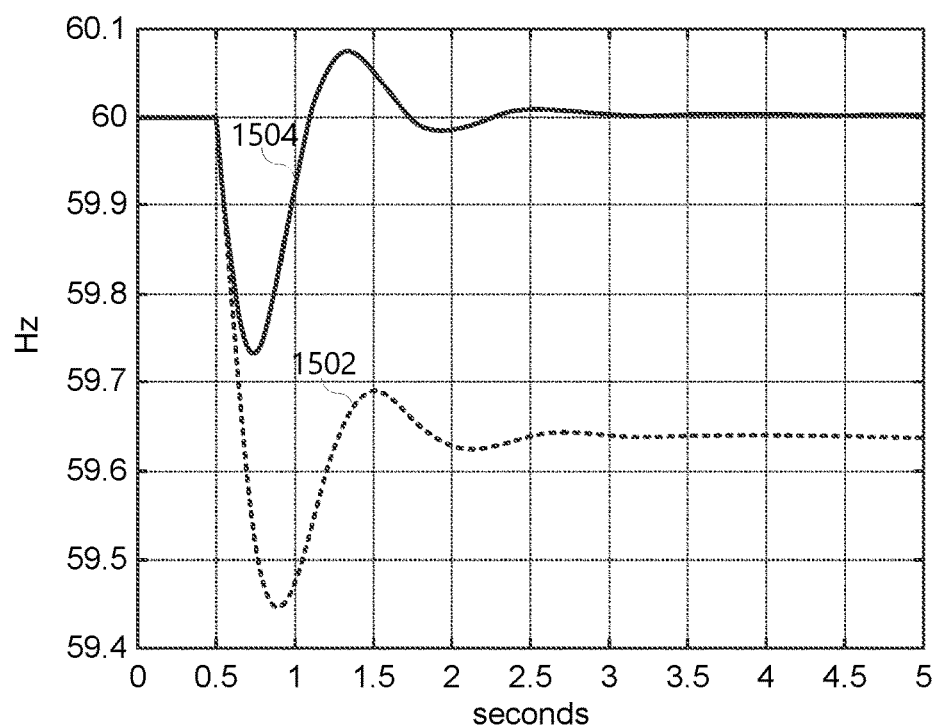
FIG. 15 illustrates test results for an energy packet controller with intentional droop added in accordance with one embodiment.

FIG. 15 illustrates test results of a generation trip frequency response. The results compare the frequency response of a traditional controller 1502 to the frequency response of an energy packet controller 1504. The load was set to 30 kW PQ. As shown in FIG. 15, the energy packet controller responds quickly and drives the power system frequency close to nominal. The constant PQ load is a challenging case. This demonstrates the versatility of the energy packet controller.

Figure 16:
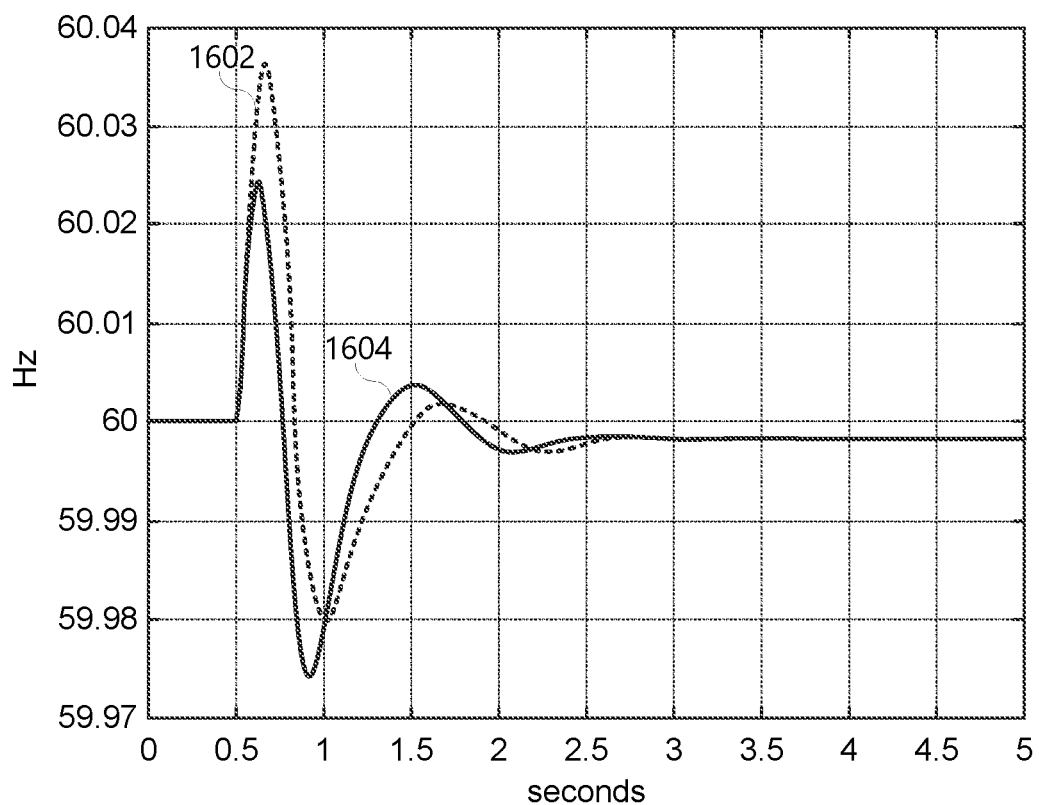
FIG. 16 illustrates test results of a generation trip frequency response in accordance with one embodiment.

FIG. 16 illustrates test results of a load composition change. The results compare the frequency response of a traditional controller 1602 to the frequency response of an energy packet controller 1604 due to PQ load abruptly change a power factor. More specifically, this test involved the constant PQ load step changing the current phase angle. In this test, the PQ load kept the average power drawn at a constant at 30 kW while step increasing the angle between voltage and current. The increase in reactive power, and therefore current, results in a momentary drop in voltage. The dynamic nature of the PQ load also exhibits a momentary drop in $P_L$, causing an increase in frequency before the PQ load adjusts to maintain a 30 kW average power.

Embodiments herein describe an energy packet controller. The energy packet controller is a new approach for primary generation control. Energy packets are based on the principle of directly measuring the load requirements on the generator, at a fixed sample rate, and moving the prime mover control to that load requirement value. Energy packets enable such an approach because they are not time-averaged quantities dependent on frequency and phase relationships. As demonstrated above, controllers based on energy packets are not only simpler but also perform better than traditional approaches The embodiments described herein are applicable to any synchronous machine driven by a prime mover. The advantages and details described below may be applied to the embodiments described herein.

Energy packets are calculated at a fixed rate, over a specified period of transfer. This method provides faster dynamic response to measuring the electric power leaving the machine via precise, accurate, and fast measurements of voltage and current to calculate discrete energy packets at time periods faster than an electrical cycle. In some embodiments, the time period over which the system calculates energy packets is selected from an inclusive range of 0.1 to 100 milliseconds.

The system may use the energy packets measurements to provide direct feedback to the prime mover reference. Thus, power is not treated as a disturbance, but a direct input into the controller's calculation of desired mechanical (prime mover) power to be applied to the generator.

The system may use electrical frequency and mechanical speed measurements (which are proportional to the integral of the power mismatch) for fine-tuning of the prime mover reference signal to precisely match mechanical prime mover power to electrical power output. Further, if there is an interruption of the power measurements, the frequency-based control provides a backup that is still stable. Speed of response and steady state frequency error performance will be degraded, but the system will still operate in a stable manner. Torque may be used as a substitute for power in certain embodiments.

The systems use of electrical packets enables advanced control without PID. Treating the compensation for frequency error and real power error separately allows more control over both. The system is able to measure and feed power into the prime mover reference signal directly. Power mismatch does not need to be inferred from frequency error and does not need to be accumulated/integrated to restore the nominal frequency. Power mismatch is directly compensated by a fast-measured power signal, so power match can be reestablished without requiring a frequency error to develop. The load-change induced frequency excursion will be smaller and therefore require less frequency response to restore frequency to nominal. Modification of the frequency feedback term allows Programmed Droop, Droop Response Shaping, Isochronous Operation, and numerous other frequency control strategies. The EP feedback enables precise control without the necessity of a PID controller and its associated complexities. Separate controls of frequency enable smooth and closely matched trajectory planning of frequency setpoints for machine redispatch operations.

The systems, devices, and methods described herein provide a stable controller with two methods (EP feedback and Precise Droop) working in conjunction to provide accurate tracking of power and frequency while eliminating the need for large controller gains. Both the power and frequency feedback terms contribute to the prime mover reference signal. As the "share the load," neither must work overly hard (i.e., have an overly large gain making their portion of the signal more susceptible to measurement noise jitter).

The systems, devices, and methods described herein allow for no tuning. The system may work out-of-the-box for a new genset. With default settings (P gain of 25), the control system may universally work on prime movers, regardless of the type of fuel injection, engine type, turbo, or fuel delivery system.

The systems, devices, and methods described herein may provide improved droop. The systems, devices, and methods described herein may provide the advantages but none of the side effects of prior droop control systems. It provides a blend of natural droop, valve reference droop, and metered/programmed droop methods. The energy packet term may dramatically reduce the need for high gains, and may eliminate the need for the integral or derivative term.

The systems, devices, and methods described herein may provide improved load share. The systems, devices, and methods described herein may provide load shares with engines and controllers of other manufactures because of low gains, no integral, no derivative, fast and accurate droop, and energy packet methods.

The systems, devices, and methods described herein may provide similar speed of response as inverter power and frequency control loops. Inverter based generation (batteries, PV, wind, other) can have very fast control reactions as they do not have inertia. This genset control technique reduces the hunting between engines and provides fast, critically damped behavior to all engines.

The systems, devices, and methods described herein may provide communication independent stability. With no dependency on communication, some embodiments herein provide for stable operation in parallel with other DERs. Redundancy in the design allows embodiments herein to remain stable under any communication failure without mode or gain changing.

The systems, devices, and methods described herein may be insensitive to load characteristics as both steady state and transient sensitivity are low. Additionally, embodiments herein may reduce gain sensitivity to load composition and inertial changes. Low gains save fuel, reduce engine wear, and reduce sensitivity to load composition changes. Some embodiments herein are insensitive to poles or zeroes movement in the mechanical drive train, or in the electrical power system.

The systems, devices, and methods described herein may provide strong disturbance rejection because accepting and rejecting full rated loads of all compositions has minimal frequency deviations.

The systems, devices, and methods described herein may be compatible with inverters. These generator control methods are predictable, monotonic, smooth, critically damped, and have low sensitivity to electronic load and inverter based DERs. Because of very low gains, inverter based DER problems are minimized. This is because the genset controls are fast but insensitive to inverter induced oscillations.

The foregoing specification has been described with reference to various embodiments, including the best mode. However, those skilled in the art appreciate that various modifications and changes can be made without departing from the scope of the present disclosure and the underlying principles of the invention. Accordingly, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Also, as used herein, the terms "coupled," "couple," and any other variation thereof are intended to cover a physical connection, an electrical connection, a magnetic connection, an optical connection, a communicative connection, a functional connection, and/or any other connection.

Principles of the present disclosure may be reflected in a computer program product on a tangible computer-readable storage medium having computer-readable program code means embodied in the storage medium. Any suitable computer-readable storage medium may be utilized, including magnetic storage devices (hard disks, floppy disks, and the like), optical storage devices (CD-ROMs, DVDs, Blu-Ray discs, and the like), flash memory, and/or the like. These computer program instructions may be loaded onto a general purpose computer, special purpose computer, or other programmable data processing apparatus to produce a machine, such that the instructions that execute on the computer or other programmable data processing apparatus create means for implementing the functions specified. These computer program instructions may also be stored in a computer-readable memory that can direct a computer or other programmable data processing apparatus to function in a particular manner, such that the instructions stored in the computer-readable memory produce an article of manufacture including instruction means which implement the function specified. The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions specified.

Principles of the present disclosure may be reflected in a computer program implemented as one or more software modules or components. As used herein, a software module or component (e.g., engine, system, subsystem) may include any type of computer instruction or computer-executable code located within a memory device and/or computer-readable storage medium. A software module may, for instance, comprise one or more physical or logical blocks of computer instructions, which may be organized as a routine, a program, an object, a component, a data structure, etc., that perform one or more tasks or implement particular data types.

In certain embodiments, a particular software module may comprise disparate instructions stored in different locations of a memory device, which together implement the described functionality of the module. Indeed, a module may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device, or across several memory devices, and may be linked together in fields of a record in a database across a network.

Suitable software to assist in implementing the invention is readily provided by those of skill in the pertinent art(s) using the teachings presented here and programming languages and tools, such as Java, Pascal, C++, C, database languages, APIs, SDKs, assembly, firmware, microcode, and/or other languages and tools.

Embodiments as disclosed herein may be computer-implemented in whole or in part on a digital computer. The digital computer includes a processor performing the required computations. The computer further includes a memory in electronic communication with the processor to store a computer operating system. The computer operating systems may include, but are not limited to, Microsoft® Windows®, Apple® MacOS®, Disk Operating system (DOS), UNIX, IRJX, Solaris, SunOS, FreeBSD, Linux®, QNX®, ffiM® OS/2®, and so forth. Alternatively, it is expected that future embodiments will be adapted to execute on other future operating systems.

In some cases, well-known features, structures, or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

While the principles of this disclosure have been shown in various embodiments, many modifications of structure, arrangements, proportions, elements, materials, and components, used in practice, which are particularly adapted for a specific environment and operating requirements, may be used without departing from the principles and scope of this disclosure. These and other changes or modifications are intended to be included within the scope of the present disclosure.

The scope of the present invention should, therefore, be determined only by the following claims.

What is claimed is:

1. A device to control a prime mover of a machine, the device comprising:
   first circuitry configured to perform:
      an energy packet measurement control to:
         calculate an energy packet associated with a monitored machine;
      a frequency control to:
         receive system feedback associated with the monitored machine, and
         generate a frequency correction based on a setpoint feedback; and
   adder circuitry configured to add the energy packet to the frequency correction, and provide a result as an input to a valve control mechanism.

2. The device of claim 1, wherein the frequency control comprises a governor.

3. The device of claim 1, wherein the frequency control comprises an automatic generation control.

4. The device of claim 1, wherein the frequency control is further to measure system frequency, and wherein the frequency correction is generated to drive an error between present frequency and target frequency to zero.

5. The device of claim 1, wherein the first circuitry comprises a power measurement sensor to obtain a power measurement of the monitored machine.

6. The device of claim 5, wherein the first circuitry further comprises:
   a state complement filter to blend a prime mover power reference and a power measurement and output a blended power feedback;
   frequency logic in communication with the state complement filter, the frequency logic to apply a droop factor to the blended power feedback and output a frequency power feedback; and a proportional gain circuit in communication with the frequency logic, the proportional gain circuit comprising:
an adder to add a revolutions per minute (RPM) measurement and the frequency power feedback,
a subtractor to reduce an RPM reference by a sum of the adder, wherein the proportional gain circuit is configured to apply a gain to a difference of the subtractor to generate the frequency correction.

7. The device of claim 6, wherein the state complement filter comprises:
a high-pass filter to filter the prime mover power reference,
a low-pass filter to filter the power measurement, and
a second adder to sum outputs of the high-pass filter and the low-pass filter.

8. The device of claim 1, wherein the energy packet measurement control calculates the energy packets by:
calculating products of a current measurement and a voltage measurement obtained over a time interval of the predetermined time interval length;
calculating a time interval power as a sum of the calculated products of the current and voltage measurements over the time interval; and
calculating an energy packet value for the time interval as a product of the time interval power and the time interval length.

9. The device of claim 8, wherein the energy packet value is calculated as:

$$\varepsilon[n]=T_s\Sigma_{m=M(n-1)+1}^{Mn}v[m]i[m] \text{ where:}$$

$\varepsilon[n]$ represents the energy packet value for sample n;
$T_s$ represents the data sample period;
M represents a factor for downsampling;
v[m] represents a voltage value at sample m; and,
i[m] represents a current value at sample m.

10. The device of claim 1, wherein the energy packet measurement control comprises an anti-alias filter, an analog-to-digital converter, an energy packet calculator, and a fuel control converter.

11. A control system for a prime mover of a machine, the system comprising:
first circuitry configured to perform:
an energy packet measurement control to:
calculate energy packets associated with a monitored machine, and
convert the energy packets into a fuel valve reference; and
a frequency control to generate frequency error corrections and power setpoint adjustments for the monitored machine,
wherein the energy packet measurement control updates the fuel valve reference faster than the frequency control generates the frequency error corrections and the power setpoint adjustments;
an adder circuit in communication with the first circuitry, the adder circuit configured to add the fuel valve reference and the frequency correction to determine a prime mover power reference; and
a communications interface configured to provide the prime mover power reference to a fuel valve control mechanism of the monitored machine.

12. The system of claim 11, wherein the frequency control comprises a governor.

13. The system of claim 11, wherein the frequency control comprises an automatic generation control.

14. The system of claim 11, wherein the energy packet measurement control calculates the energy packets by:
calculating products of a current measurement and a voltage measurement obtained over a time interval of the predetermined time interval length;
calculating a time interval power as a sum of the calculated products of the current and voltage measurements over the time interval; and
calculating an energy packet value for the time interval as a product of the time interval power and the time interval length.

15. A device to control a prime mover of a machine, the device comprising:
a first circuitry comprising:
an energy packet measurement feedback loop configured to perform an energy packet control to calculate energy packets associated with a monitored machine, and convert the energy packets into a fuel valve reference;
a frequency control feedback loop comprising:
a power measurement sensor to obtain a power measurement of the monitored machine, and
a filter to blend a prime mover power reference and the power measurement and output a blended power feedback, wherein the frequency control feedback loop is configured to perform a frequency control in communication with the filter, the frequency control to apply a droop factor to the blended power feedback and output a frequency power feedback, and
a proportional gain circuit to generate the frequency correction using the frequency power feedback, a revolutions per minute (RPM) measurement, and an RPM reference; and
a fuel valve calculator in communication with the energy packet measurement control and the frequency control, the fuel valve calculator configured to add the fuel valve reference and the frequency correction to determine the prime mover power reference, and provide the prime mover power reference to a fuel valve control mechanism of the monitored machine.

16. The device of claim 15, wherein the state complement filter comprising:
a high-pass filter to filter the prime mover power reference,
a low-pass filter to filter the power measurement, and
an adder to sum outputs of the high-pass filter and the low-pass filter.

17. The device of claim 15, wherein the filter performs a weighted summation to blend the prime mover power reference and the power measurement.

18. The device of claim 15, wherein the filter performs an advanced weighted summation to blend the prime mover power reference and the power measurement where a first gain associated with the mover reference and a second gain associated with the power measurement are determined based on a dynamic model, machine measurements, and control signals.

19. The device of claim 15, wherein the filter is a Kalman filter.

20. The device of claim 15, wherein an energy packet value of the energy packet is calculated as:

$$\varepsilon[n]=T_s\Sigma_{m=M(n-1)+1}^{Mn}v[m]i[m] \text{ where:}$$

$\varepsilon[n]$ represents the energy packet value for sample n;
$T_s$ represents the data sample period;

M represents a factor for downsampling;
v[m] represents a voltage value at sample m; and,
i[m] represents a current value at sample m.

\* \* \* \* \*